United States Patent
Chung et al.

(10) Patent No.: US 6,887,627 B2
(45) Date of Patent: May 3, 2005

(54) METHOD OF FABRICATING PHASE SHIFT MASK

(75) Inventors: Henry Wei-Ming Chung, Taipei (TW); Chi-Yuan Hung, Ilan (TW); Ching-Yu Chang, Ilan Hsien (TW); I-Pien Wu, Hsinchu (TW)

(73) Assignee: Macronix International Co., Ltd. (TW)

( * ) Notice: Subject to any disclaimer, the term of this patent is extended or adjusted under 35 U.S.C. 154(b) by 202 days.

(21) Appl. No.: 10/132,156

(22) Filed: Apr. 26, 2002

(65) Prior Publication Data

US 2003/0203285 A1 Oct. 30, 2003

(51) Int. Cl.$^7$ ................................................ G03F 9/00
(52) U.S. Cl. ......................... 430/5; 430/322; 430/323; 430/324
(58) Field of Search .............................. 430/5, 322–324

(56) References Cited

U.S. PATENT DOCUMENTS 5,622,814 A * 4/1997 Miyata et al. ............... 430/314
5,932,489 A * 8/1999 Huang ......................... 430/322
6,251,547 B1 * 6/2001 Tzu et al. ....................... 430/5
6,423,455 B1 * 7/2002 Tzu ................................. 430/5

* cited by examiner

Primary Examiner—Geraldine Letscher
(74) Attorney, Agent, or Firm—Dickinson Wright PLLC

(57) ABSTRACT

A method of fabricating a phase shift mask (PSM) is described. A patterned photoresist layer is formed on an opaque layer over a transparent plate. A thin mask layer is formed on the sidewalls of the patterned photoresist layer. The exposed opaque layer and transparent plate thereunder are then removed while using the patterned photoresist layer and mask layer as a mask. A phase shift opening is formed in the transparent plate, and thereby a phase shift layer is formed at the place where the phase shift opening is located. The patterned photoresist layer and the opaque layer thereunder are then removed to expose the transparent plate. The opaque layer under the mask layer can precisely self-align the phase shift layer to prevent alignment deviation caused by multiple lithography processes. The precision of the phase shift mask can be increased, and mask manufacture cost can be lowered.

18 Claims, 2 Drawing Sheets

US 6,887,627 B2

METHOD OF FABRICATING PHASE SHIFT MASK

FIELD OF THE INVENTION

The present invention relates to a method of fabricating a photo mask, and more particularly to a method of fabricating a phase shift mask (PSM), which eliminates one lithographic process to obtain a precise mask pattern.

BACKGROUND OF THE INVENTION

In the semiconductor industry, photolithographic exposure tools such as steppers and scanners have been used to define patterns in photosensitive material known as photoresist. After photoresist material is spun onto a substrate, an exposure tool repeatedly projects an image of the pattern to be defined on the mask to repeatedly expose the photoresist layer. The properties of the exposed portions of the photoresist layer are altered for subsequent processing steps such as resist development and consecutive substrate etching or implantation.

A mask is typically a transparent plate such as quartz with opaque elements such as a chrome layer on the plate used to define a pattern. A radiation source illuminates the mask according to well-known methods. The radiation transmitted through the mask and exposure tool projection optics forms a diffraction-limited latent image of the mask features on the photoresist layer. Further discussion of patterning principles and diffraction limited microlithography can be found on pages 274–276 of VLSI Technology edited by S. M. Sze (® 1983).

However, because of increased semiconductor device complexity, which results in increased pattern complexity, increased resolution demands, and increased pattern packing density on the mask, the distance between any two opaque areas has decreased. By decreasing the distances between the opaque areas, small apertures are formed which diffract the light that passes through the apertures. The diffracted light results in effects that tend to spread or to bend the light as it passes so that the space between the two opaque areas is not resolved, therefore making diffraction a severely limiting factor for conventional optical lithography.

As feature sizes decrease, semiconductor devices are typically less expensive to manufacture and demonstrate higher performance. In order to produce smaller feature sizes, an exposure tool having adequate resolution and depth of focus at least as deep as the thickness of the photoresist layer is desired. For exposure tools that use conventional or oblique illumination, better resolution can be achieved by lowering the wavelength of the exposing radiation or by increasing the numerical aperture of the exposure tool, but the smaller resolution gained by increasing the numerical aperture is typically at the expense of a decrease in the depth of focus for minimally resolved features. This constraint presents a difficult problem in reducing the patterning resolution for a given radiation wavelength.

One method of printing smaller features with smaller critical dimensions while maintaining a sufficient depth of focus involves the use of a phase shift mask (PSM). A PSM uses phase shift layers, which shift the phase of the incident radiation to transmit radiation 180 degrees out of phase compared to radiation transmitted by adjacent non-shifted layers. The radiation transmitted by the phase shift layers destructively interferes with radiation transmitted by adjacent non-shifted layers in the areas of the image plane most susceptible to depth of focus limitations. How to further improving the resolution and depth of focus limitations is an exigent object to be overcome.

SUMMARY OF THE INVENTION

The present invention provides a method of fabricating a phase shift mask layer. An opaque layer is formed between a transparent area and a phase shift area to increase the resolution of the photo mask. The photo mask of the present invention can obtain a precise mask pattern by providing self-aligned technology. Only one lithography process is employed to prevent alignment deviation caused by multiple lithography processed, and the manufacturing costs can thus be decreased.

In one aspect, the present invention provides a method of fabricating a phase shift mask. The method comprises at least the following steps. An opaque layer and a patterned photoresist layer are formed sequentially on a transparent plate. A mask layer is then formed over the opaque layer and the patterned photoresist layer. A portion of the mask layer is removed to leave a portion of the mask layer on the sidewalls of the patterned photoresist layer and to expose the opaque layer. The exposed portion of the opaque layer and the portion of the transparent plate thereunder are removed to form a phase shift opening in the transparent plate. The patterned photoresist layer and the underlying portion of the opaque layer are then removed.

In another aspect, the present invention also provides a method of fabricating a phase shift mask. The method comprises at least the following steps. An opaque layer is formed on a transparent plate, and a patterned photoresist layer is formed on the opaque layer. The patterned photoresist layer swells to form a swelled portion on the sidewalls of the patterned photoresist layer and covers a portion of said opaque layer adjacent to said patterned photoresist layer. The exposed portion of the opaque layer and the underlying portion of the transparent plate are removed to form a phase shift opening in the transparent plate. The patterned photoresist layer and the underlying portion of the opaque layer are then removed.

In yet another aspect, the present invention also provides a method of fabricating a phase shift mask. The method at least comprises the following steps. An opaque layer is formed on a transparent plate, and a first mask layer is formed on the opaque layer. A second mask layer is formed on the sidewalls of the first mask layer to cover a portion of the opaque layer adjacent to the first mask layer. The exposed portion of the opaque layer and the underlying portion of the transparent plate are removed to form a phase shift opening in the transparent plate. The first mask layer and the underlying portion of the opaque layer are then removed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a method of fabricating a phase shift mask. A mask layer is formed on the sidewalls of a patterned photoresist layer to self-align the opaque pattern between a transparent area and a phase shift area. Only one lithography process is required, so that pattern precision of the photo mask is increased and the cost of manufacturing is lowered.

Figure 1A:
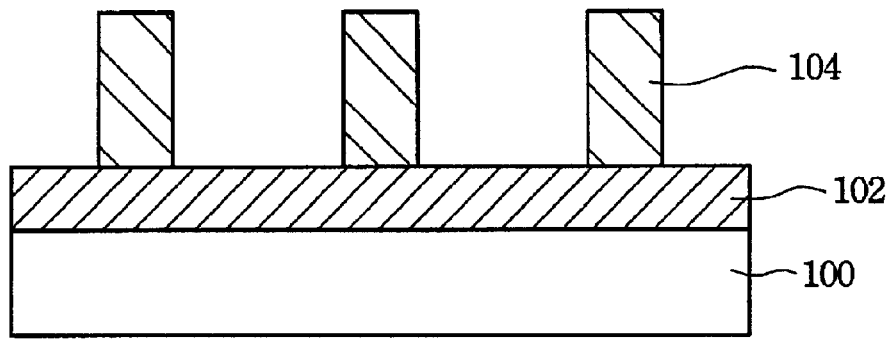
FIGS. 1A–1F are schematic cross-sectional views according to one preferred embodiment of the present invention.

FIGS. 1A–1F are schematic cross-sectional views according to one preferred embodiment of the present invention. Referring to FIG. 1A, a transparent plate 100 such as a quartz plate is provided. An opaque layer 102 is then formed on the transparent plate 100. The material of the opaque layer 102 can be chrome (Cr), chrome oxide (CrO), combinations thereof or other opaque materials. A patterned photoresist layer is subsequently formed on the opaque layer 102 to cover a predetermined area for transmitted incident light and to serve as a mask for subsequent photo mask pattern fabrication. The patterned photoresist layer 104 can be formed by conventional lithography technology. For example, a base photoresist layer consisting of photo active compound (PAC) is coated on the opaque layer 102, and is then treated with exposing, developing, baking, and other steps to obtain the desired pattern on the photoresist layer.

Figure 1B:
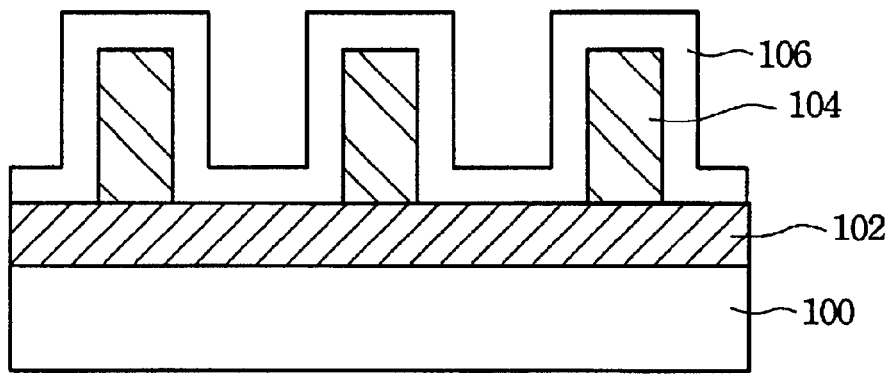

Referring to FIG. 1B, a thin mask layer 106 is then formed over the transparent plate 100 to cover the opaque layer 102 and patterned photoresist layer 104. The mask layer 106 is preferably conformal to the opaque layer 102 and patterned photoresist layer 104, that is, the mask layer 106 follows the topography of the transparent plate 100. The mask layer 106 has a thickness of about 0.01–0.5 times the line width of the mask pattern and must be designed according to each individual case. Moreover, the thickness of the mask layer 106 can be precisely controlled by proper process parameters. The thickness can even be controlled to less than several angstroms.

Variant materials and fabricating processes can be chosen for the mask layer 106. The intention of the present invention is to cover various modifications and similar materials and processes within the spirit and scope of the present invention. For example, the mask layer 106 can be a silicon oxide layer deposited by chemical vapor deposition (CVD) and the photoresist layer 104 selected can include a silylatable photoresist material. After the silicon oxide layer is deposited on the photoresist layer 104, a step of silylation can be performed to improve the adhesion between the photoresist layer 104 and mask layer 106. Furthermore, the mask layer 106 also can be a polymer layer, such as a bottom anti-reflection coating (BARC) layer, formed by spin-on coating technology.

Figure 1C:
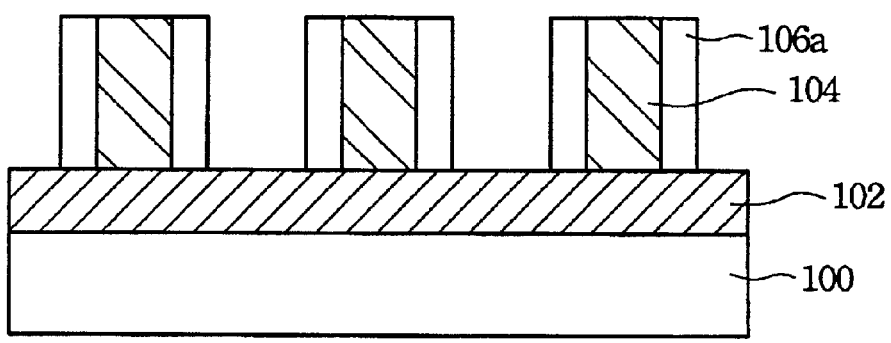

Referring to FIG. 1C, an isotropic dry etching process is then performed to remove the portion of the mask layer 106 on the photoresist layer 104 and opaque layer 102 until the opaque layer 102 is exposed, so a portion of the mask layer 106a remains on the sidewalls 105 of the photoresist layer 104 to serve as a mask for the later processes. Since the mask layer 106 is relatively thin, the width of the remaining mask layer 106a on the sidewalls 105 of the photoresist layer 104 is correspondingly narrow and precise. This is helpful for line width control of the opaque pattern.

Alternatively, instead of the foregoing processes, a photoresist swelling technology can be also employed. The photoresist layer 104 swells or expands to add a swell portion, i.e. at the position of the remaining mask layer 106a, for covering the opaque layer 102 adjacent to the photoresist layer 104. For example, the photoresist layer 104 can be a hydrophilic resin having swelling properties. The photoresist layer 104 undergoes a Relacs process in which the photoresist swells so that the swell portion 106a is formed as a mask for a subsequent etching process of opaque layer 102, as shown in FIG. 1C. The photoresist swelling can be induced by wetting the photoresist with a solvent or by treating the photoresist with an organic material, such as a saturated hydrocarbon, e.g., aliphatic or aromatic hydrocarbon such that the photoresist layer 104 swells.

Figure 1D:
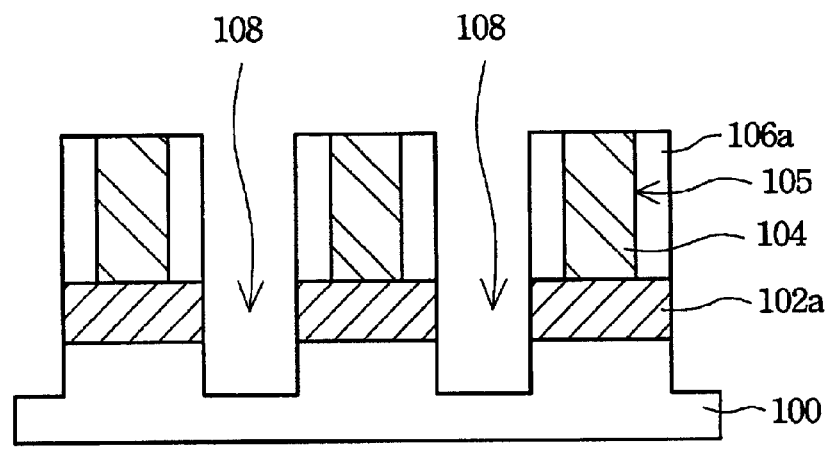

Referring to FIG. 1D, the exposed portion of the opaque layer 102 is then anisotropically etched while using the photoresist layer 104 and the remaining mask layer 106a as an etching mask, and thus the remaining opaque layer 102a is formed.

The underlying portion of the transparent plate 100 is continuously etched to form a phase shift opening 108 in the transparent plate 100. The portion of the transparent plate 100 under the phase shift opening 108 forms a phase shift layer to be a part of photo mask pattern. When an incident light is transmitted through the phase shift layer of the transparent plate 100 under the phase shift opening 108, the phase of the incident light will shift 180 degrees.

Figure 1E:
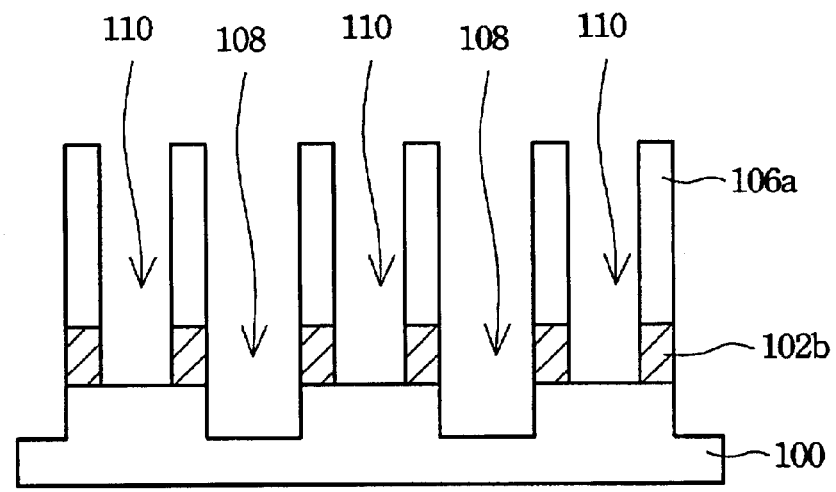

Referring to FIG. 1E, the photoresist layer 104 is then removed, and is preferably removed by a wet dip process to prevent damage to the phase shift opening 108. The portion of the opaque layer 102a under the removed photoresist layer 104 is subsequently removed to form a transparent opening 110 to be a part of the photo mask pattern, and thus a remaining portion of the opaque layer 102b is formed. When an incident light is transmitted through the area of the transparent plate 100 under the phase shift opening 108, the incident light remains in its original phase. Only one lithography process is used for fabricating the phase shift opening 108 and transparent opening 110. Therefore, pattern distortion and resolution decrease caused from alignment deviation in multiple lithography processes can be prevented.

Figure 1F:
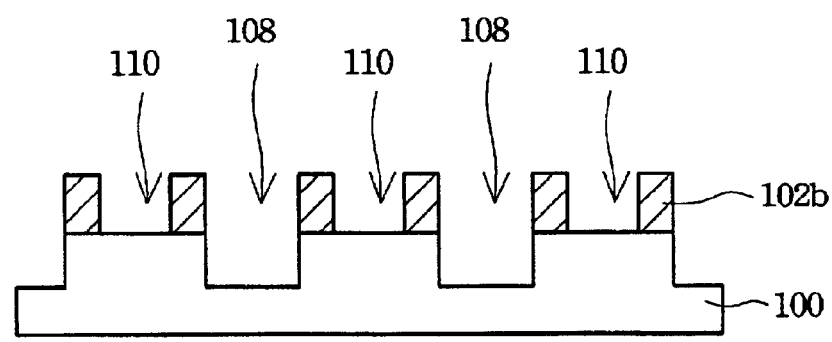

Referring to FIG. 1F, the mask layer 106a on the opaque layer 102b is finally removed to form the phase shift mask of the present invention. After the incident light is transmitted through the areas of the transparent plate 100 under the phase shift opening 108 and transparent opening 110, the incident light transmitted by the phase shift opening 108 shifts the phase 180 degrees and destructively interferes to decrease light intensity at the boundary. The opaque layer 102b between the phase shift opening 108 and transparent 110 can eliminate the transmitted light intensity at the boundary, so that the resolution can be further improved.

According to above description, the present invention provides a method of fabricating a phase shift mask layer. By forming a self-aligned mask layer, only one lithography process is used so that alignment deviation caused by multiple lithography processes can be prevented. Hence, the precision of mask pattern can be improved, and mask manufacture cost can be decreased.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. A method of fabricating a phase shift mask, comprising the steps of:

forming an opaque layer and a patterned photoresist layer sequentially on a transparent plate;

forming a mask layer over said opaque layer and said patterned photoresist layer;

removing a portion of said mask layer to leave a portion of said mask layer on sidewalls of said patterned photoresist layer and to expose said opaque layer;

removing an exposed portion of said opaque layer and a portion of said transparent plate thereunder to form a phase shift opening; and removing said patterned photoresist layer and a portion of said opaque layer under said patterned photoresist layer.

2. The method according to claim 1, wherein a material of said opaque layer is selected from the group consisting of chrome, chrome oxide, and combinations thereof.

3. The method according to claim 1, wherein said mask layer comprises a silicon oxide layer.

4. The method according to claim 1, wherein said mask layer comprises a polymer layer.

5. The method according to claim 1, wherein the step of forming said mask layer comprises chemical vapor deposition.

6. The method according to claim 1, wherein the step of forming said mask layer comprises spin-on coating.

7. The method according to claim 1, wherein the step of removing said mask layer comprises anisotropic dry etching.

8. The method according to claim 1, wherein a width of said mask layer on the sidewalls of said patterned photoresist layer is about 0.01–0.5 times a width of said patterned photoresist layer.

9. A method of fabricating a phase shift mask, comprising the steps of:

forming an opaque layer on a transparent plate;

forming a patterned photoresist layer on said opaque layer;

swelling said patterned photoresist layer to form a swollen portion on sidewalls of said patterned photoresist layer and cover a portion of said opaque layer adjacent to said patterned photoresist layer;

removing an exposed portion of said opaque layer and a portion of said transparent plate thereunder to form a phase shift opening; and removing said patterned photoresist layer and a portion of said opaque layer under said patterned photoresist layer.

10. The method according to claim 9, wherein a material of said opaque layer is selected from a group consisting of chrome, chrome oxide, and combinations thereof.

11. The method according to claim 9, wherein the step of swelling said patterned photoresist layer comprises a Relacs process.

12. The method according to claim 9, wherein a width of said mask layer on the sidewalls of said patterned photoresist layer is about 0.01–0.5 times a width of said patterned photoresist layer.

13. A method of fabricating a phase shift mask, comprising the steps of:

forming an opaque layer on a transparent plate;

forming a first mask layer on said opaque layer;

forming a second mask layer on sidewalls of said first mask layer to cover a portion of said opaque layer adjacent to said first mask layer;

removing an exposed portion of said opaque layer and a portion of said transparent plate thereunder to form a phase shift opening; and removing said first mask layer and a portion of said opaque layer under said first mask layer.

14. The method according to claim 13, wherein said first mask layer comprises a patterned photoresist layer.

15. The method according to claim 13, wherein forming said second mask layer comprises the steps of:

forming a material layer over said opaque layer and said first mask layer; and removing a portion of said material layer to leave a portion of said material layer on the sidewalls of said first mask layer to form said second mask layer and to expose said opaque layer.

16. The method according to claim 13, wherein forming said second mask layer comprises the step of:

swelling said first mask layer to form said second mask on the sidewalls of said first mask layer to cover a portion of said opaque layer adjacent to said first mask layer.

17. The method according to claim 16, wherein the step of swelling said first mask layer comprises a Relacs process.

18. The method according to claim 13, wherein a width of said second mask layer on the sidewalls of said first mask layer is about 0.01–0.5 times a width of said first mask layer.

* * * * *